United States Patent
Metz et al.

(10) Patent No.: US 7,400,181 B2
(45) Date of Patent: Jul. 15, 2008

(54) METHOD AND APPARATUS FOR DELAY LINE CONTROL USING RECEIVE DATA

(75) Inventors: Peter C. Metz, Macungie, PA (US); Gregory W. Sheets, Bangor, PA (US)

(73) Assignee: Agere Systems Inc., Allentown, PA (US)

( * ) Notice: Subject to any disclaimer, the term of this patent is extended or adjusted under 35 U.S.C. 154(b) by 34 days.

(21) Appl. No.: 11/241,758

(22) Filed: Sep. 30, 2005

(65) Prior Publication Data

US 2007/0075759 A1    Apr. 5, 2007

(51) Int. Cl.
*H03L 7/06* (2006.01)
(52) U.S. Cl. .................................. 327/149; 327/158
(58) Field of Classification Search ................. 327/147, 327/149, 156, 158
See application file for complete search history.

(56) References Cited

U.S. PATENT DOCUMENTS

| | | | |
|---|---|---|---|
| 2002/0085656 A1* | 7/2002 | Lee et al. | 375/355 |
| 2005/0108600 A1* | 5/2005 | Arguelles | 714/701 |
| 2005/0157780 A1* | 7/2005 | Werner et al. | 375/232 |
| 2006/0114039 A1* | 6/2006 | Freyman et al. | 327/161 |
| 2007/0002990 A1* | 1/2007 | Lee et al. | 375/355 |

* cited by examiner

*Primary Examiner*—Kenneth B. Wells
*Assistant Examiner*—Ryan C Jager
(74) *Attorney, Agent, or Firm*—Ryan, Mason & Lewis, LLP (57) ABSTRACT

Methods and apparatus are provided for delay line control using receive data. A delay in a Delay-Locked-Loop circuit is controlled by obtaining a plurality of samples of one or more received signals for each unit interval; determining a data eye width in the one or more received signals; and adjusting a delay of at least one clock signal based on the data eye width. For example, the measured data eye width can be compared to a predefined value, such as a desired or ideal value. Generally, the delay is not adjusted in accordance with the present invention until the Delay-Locked-Loop circuit has reached a locked condition based on one or more predefined criteria.

19 Claims, 6 Drawing Sheets

*FIG. 7*  N-SLICER STEPPING PER PHASE LOCATION

*FIG. 8*

METHOD AND APPARATUS FOR DELAY LINE CONTROL USING RECEIVE DATA

FIELD OF THE INVENTION

The present invention is related to techniques for controlling the phase of one or more clock signals and, more particularly, to techniques for controlling the phase of one or more clock signals in a Delay-Locked-Loop.

BACKGROUND OF THE INVENTION

In many applications, including clock recovery applications, it is often necessary to compare and control the phase of one or more clock signals. For example, in one common type of analog Clock and Data Recovery system (CDR), the phase of the input data is compared to the phase of two or more sampling clocks. The sampling clocks may be generated, for example, from a fixed reference clock by a Delay-Locked-Loop (DLL). A DLL is a control loop, separate from the primary CDR control loop, that acts to control the spacing between the sampling clocks. The DLL develops a set of phases that are "selected" and interpolated by the CDR control loop to obtain the correct phase required to match-up with the incoming data transition phase.

Typically, a phase detector in the DLL determines the phase difference between adjacent rising edges of two delayed clock signals. If the phase detector detects a phase lag between the rising edges, the phase detector generates a downward control signal, indicating an extent of the phase lag. Likewise, if the phase detector detects a phase lead between the rising edges, the phase detector generates an upward control signal, indicating an extent of the phase lead. The upward and downward control signals are typically applied to a charge pump that generates a positive or negative current pulse having a pulse width that is proportional to the phase difference. Thereafter, the current pulse generated by the charge pump is typically integrated by a loop filter, such as a capacitor. The capacitor voltage is then applied to a bias voltage generator which provides the Voltage Controlled Delay Loop (VCDL) control voltages. The VCDL control voltages then change to raise or lower the delay of each delay cell within the VCDL.

The charge pump and integration capacitor require large area, contributing to the size of any integrated circuit incorporating such a DLL circuit. In addition, since the pulse width of the current generated by the charge pump is proportional to the phase difference, the pulse width must get progressively smaller as the phase difference is reduced. In practice, however, the generation of such small current pulses is difficult and often will result in imperfect linearity as the phase difference approaches zero (0).

A number of techniques have been proposed or suggested for maintaining loop stability and reducing the size of DLL circuits. For example, one proposed technique avoids narrow current pulses by employing a bang-bang phase detector. Another proposed technique replaces the charge-pump and integration capacitor with a digital-accumulator/digital-to-analog converter combination. Another proposed technique uses a smaller digital-accumulator in conjunction with a Sigma-Delta converter/Master-Slave digital-to-analog converter combination.

A need therefore exists for improved techniques for controlling the phase or delay in an analog delay line. A further need exists for an improved delay control circuit for a DLL that exhibits reduced area requirements.

SUMMARY OF THE INVENTION

Generally, methods and apparatus are provided for delay line control using receive data. According to one aspect of the invention, a delay in a Delay-Locked-Loop circuit is controlled by obtaining a plurality of samples of one or more received signals for each unit interval; determining a data eye width in the one or more received signals; and adjusting a delay of at least one clock signal based on the data eye width. For example, the measured data eye width can be compared to a predefined value, such as a desired or ideal value. Generally, the delay is not adjusted in accordance with the present invention until the Delay-Locked-Loop circuit has reached a locked condition based on one or more predefined criteria.

According to another aspect of the invention, a delay in a Delay-Locked-Loop circuit is controlled by obtaining a plurality of samples of one or more received signals for each unit interval; identifying a location of transitions in the one or more received signals based on the samples; and adjusting a delay of at least one clock signal based on the identified transition locations.

A more complete understanding of the present invention, as well as further features and advantages of the present invention, will be obtained by reference to the following detailed description and drawings.

DETAILED DESCRIPTION

Figure 1:
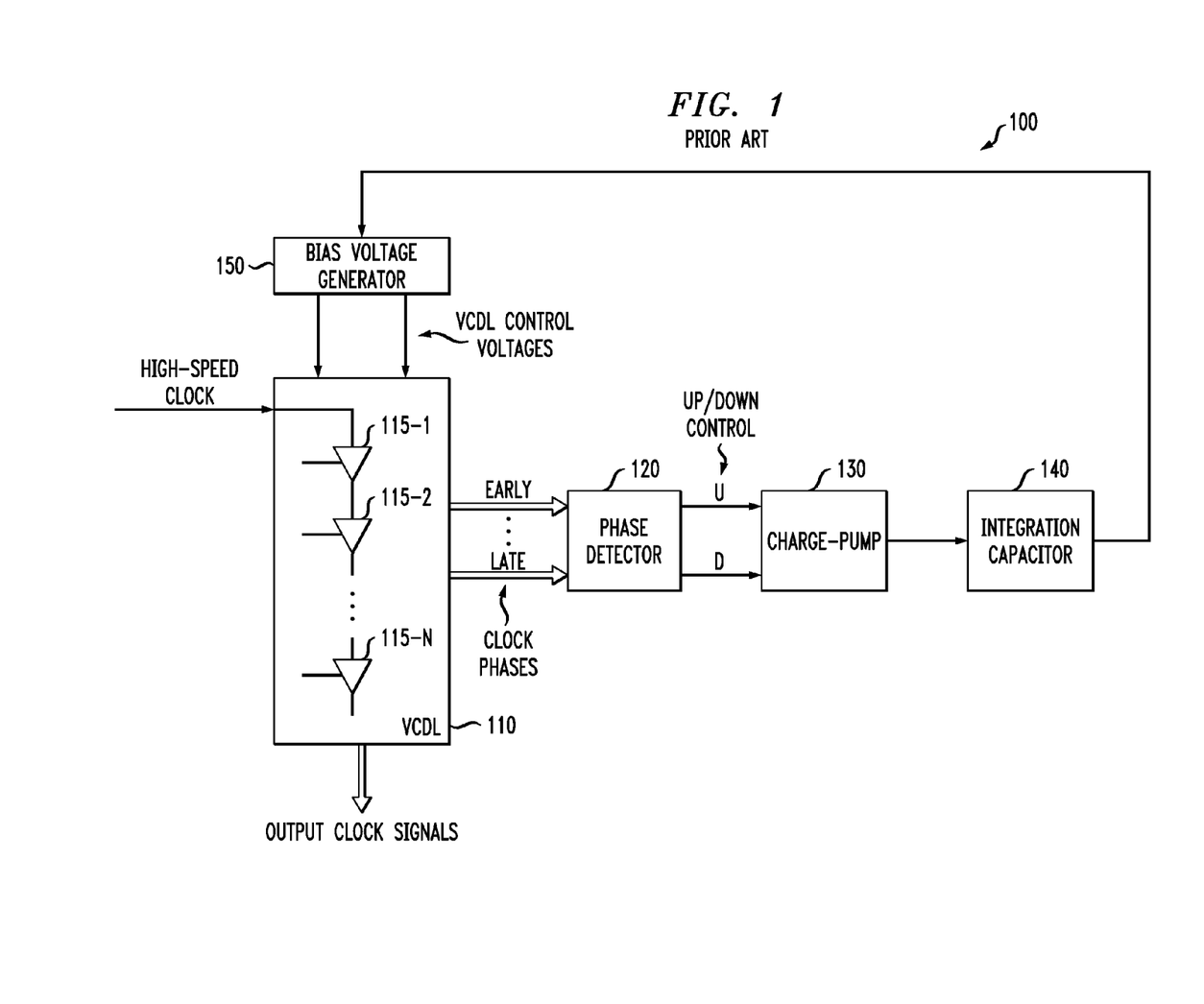
FIG. 1 illustrates a conventional DLL circuit.

FIG. 1 illustrates a conventional DLL circuit 100. As shown in FIG. 1, the DLL circuit 100 comprises a voltage controlled delay line (VCDL) 110, a phase detector 120, a charge pump 130, an integration capacitor 140 and a bias voltage generator 150. The voltage controlled delay line 110 can be embodied, for example, using the VCDL circuits described in U.S. patent application Ser. No. 10/999,900, filed Nov. 30, 2004, entitled, "Voltage Controlled Delay Loop and Method with Injection Point Control," incorporated by reference herein.

As shown in the exemplary embodiment of FIG. 1, a voltage controlled delay line 110 is typically comprised of a cascaded chain of delay elements 115-1 through 115-N, hereinafter, collectively referred to as delay elements 115, each having a nominal delay value that is controlled by an input voltage or current, to produce a plurality of phase shifted clock signals, such as the "early" and "late" clock signals shown in FIG. 1, as well as a plurality of output clock signals (used for CDR).

Generally, the phase detector 120 determines the phase difference between rising edges of the early and late clock signals generated by the voltage controlled delay line 110. If the phase detector 120 detects that the phase of the late clock lags the phase of the early clock, the phase detector 120 generates a downward control signal, D, the magnitude of which is proportional to the phase lag. Likewise, if the phase detector 120 detect that the phase of the late clock leads the phase of the early clock, the phase detector 120 generates an upward control signal, U, the magnitude of which is proportional to the phase lead.

The charge pump 130 generates a positive or negative current pulse having a pulse width that is proportional to the phase difference. As shown in FIG. 1, the current pulse generated by the charge pump 130 is integrated by a loop filter, such as a capacitor 140, in a known manner. The capacitor voltage is then applied to a bias voltage generator 150 which provides the VCDL control voltages. The VCDL control voltages then change to raise or lower the delay of each delay cell within the VCDL.

As previously indicated, the pulse width of the current generated by the charge pump 130 is proportional to the phase difference. Thus, the pulse width must get progressively smaller as the phase difference is reduced. In practice, such small current pulses are difficult to generate and results in imperfect linearity as the phase difference approaches 0.

Figure 2:
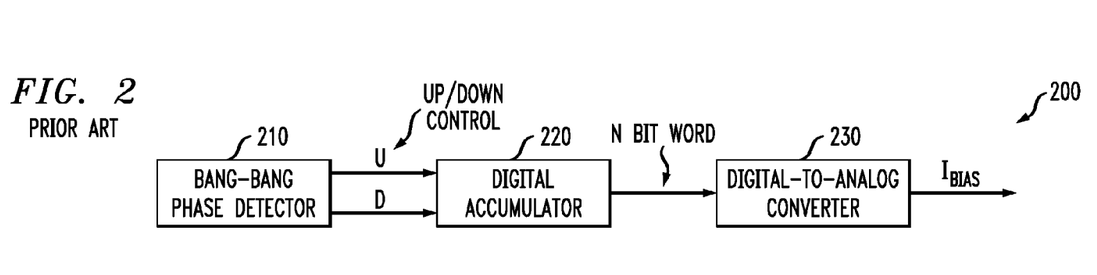
FIG. 2 illustrates an alternate implementation of the DLL circuit of FIG. 1, in which the analog integrator is replaced by a digital integrator and a digital-to-analog converter.

FIG. 2 illustrates an alternate implementation of phase detection and digital-to-analog conversion techniques for the DLL circuit of FIG. 1. The implementation shown in FIG. 2 recognizes that the bang-bang phase detector, such as described in J. D. H. Alexander, "Clock Recovery from Random Binary Signals," *Electronics Letters*, Vol. 11, 541-42 (October, 1975), will always toggle and generate an upward or downward control signal, U/D, and never reach the desired phase difference value of 0. As shown in FIG. 2, a digital accumulator 220 is employed to process the output of a bang-bang phase detector 210. The digital accumulator 220 acts as an integrator, replacing the charge-pump 130 and integration capacitor 140. The stabilizing effect of increasing the size of the integration capacitor in the DLL of FIG. 1 is achieved in FIG. 2 by increasing the width of the digital word in digital accumulator 220.

Assuming the bang-bang phase detector 210 generates a value of +1 to indicate a phase lead, and a value of −1 to indicate a phase lag, the digital accumulator 220 will add the generated values of +1 and −1 and produce an N bit digital word that is applied to a digital-to-analog converter 230. For example, in an 8 bit implementation, the output of the digital accumulator 220 will vary between 0 and 255 to indicate a phase difference. The digital-to-analog converter 230 generates a bias current, $I_{bias}$, based on the digital word. The digital value generated by the digital accumulator 220 may initially demonstrate significant variation, as the phase difference settles, and then ultimately settle to a small range of variation, typically no larger than ±1 least-significant bit (LSB) of the digital-to-analog converter (DAC), and the phase difference varies around zero.

In a DLL application, the oscillation in the phase difference caused by the bang-bang phase detector generating either an upward or downward control signal, U/D, and never reaching the desired phase difference value of 0, will cause jitter (i.e., the clock edges to move around). In order to minimize this jitter, the number of bits, N, processed by the digital accumulator 220 and digital-to-analog converter 230 must be large. The cost of a digital-to-analog converter 230 increases with the number of bits, N, and quickly becomes prohibitively expensive.

Figure 3:
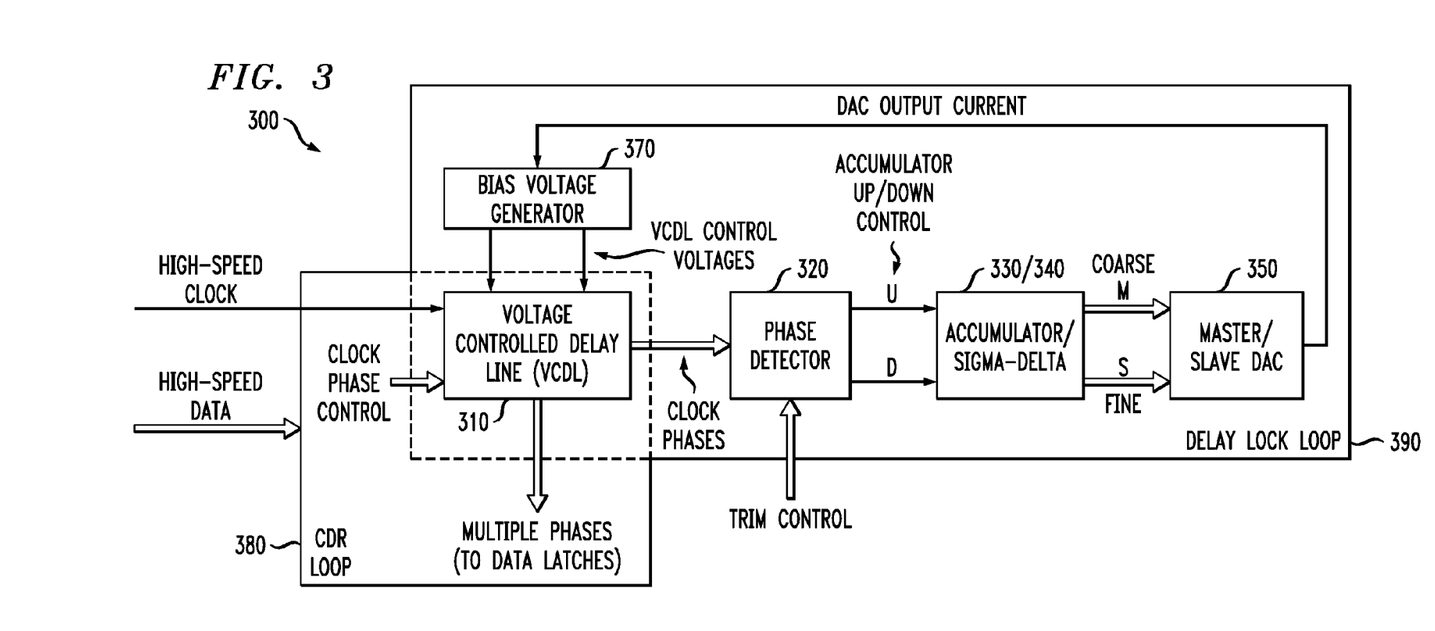
FIG. 3 is a schematic block diagram of a DLL circuit.

FIG. 3 is a schematic block diagram 300 of a clock and data recovery circuit 380 and a DLL circuit 390, in accordance with the teachings of U.S. patent application Ser. No. 11/221, 387, entitled "Method and Apparatus for Sigma-Delta Phase Control in a Delay-Locked-Loop," incorporated by reference herein. Generally, the DLL circuit 390 employs a sigma-delta circuit 340 to convert the high resolution quantized data of the digital accumulator 330 into lower resolution quantized data that can be converted to an analog signal by a digital-to-analog converter 340. The sigma-delta circuit 340 and digital accumulator 330 can be independent devices, or integrated as a single device, as shown in FIG. 3. The Voltage Controlled Delay Line (VCDL) 310 operates in the same manner as described above in conjunction with FIG. 1 to produce a plurality of phase shifted clock signals. The Voltage Controlled Delay Line 310 can be embodied, for example, using the VCDL circuits described in U.S. patent application Ser. No. 10/999,900, filed Nov. 30, 2004, entitled, "Voltage Controlled Delay Loop and Method with Injection Point Control," incorporated by reference herein. The sigma-delta circuit 340 may be embodied, for example, using any of the techniques that are widely described in the literature, for example, J. Candy and G. Temes, "Oversampling Methods for A/D and D/A Conversion," in Oversampling Delta-Sigma Converters, 1-25 (1992, IEEE Press).

The phase detector 320 operates in the same manner as described above in conjunction with FIG. 2 to determine the phase difference between adjacent rising edges of the clock signal generated by the voltage controlled delay line 310 and generate an upward or downward control signal, U/D, indicating whether there is a phase lead or lag, respectively. The phase detector 320 may be implemented, for example, as a bang-bang phase detector 120, such as those described in J. D. H. Alexander, "Clock Recovery from Random Binary Signals," *Electronics Letters*, Vol. 11, 541-42 (October, 1975).

As previously indicated, the digital accumulator 330 (with a large number of bits, N) acts as an integrator, replacing the charge-pump 130 and integration capacitor 140 of FIG. 1. The sigma-delta circuit 340 converts the high resolution quantized data, generated by the digital accumulator 330, into lower resolution quantized data for the DAC 340. As shown in FIG. 3, the N bit output of the digital accumulator 330 is reduced to an M bit output by the sigma-delta circuit 340, where M is less than N. For example, if the digital accumulator 330 employs N=8 bits, and the sigma-delta circuit 340 provides an M=4 bit output, the sigma-delta circuit 340 must translate the 256 levels provided by the digital accumulator 330 to one of 16 levels (4 bits). In other words, each step of the sigma-delta circuit 340 covers 16 steps of the digital accumulator 330. Thus, if the digital accumulator 330 generates a decimal value of 55 (55/256), which is between the third (48) and fourth (64) levels of the sigma-delta circuit 340, the sigma-delta circuit 340 will alternately generate values of 3 and 4, such that the time average is 55.

The sigma-delta circuit 340 also performs "noise-shaping" on the quantization noise. Generally, the sigma-delta circuit 340 shifts the quantization noise of the M-bit DAC to a high frequency range where a low-pass-filter (LPF) is optionally employed to attenuate this noise component.

For a discussion of suitable master/slave digital-to-analog converters 350, see, U.S. patent application Ser. No. 11/141, 498, entitled "Method and Apparatus for Master/Slave Digital-To-Analog Conversion," filed May 31, 2005 and incorporated by reference herein.

Figure 4:
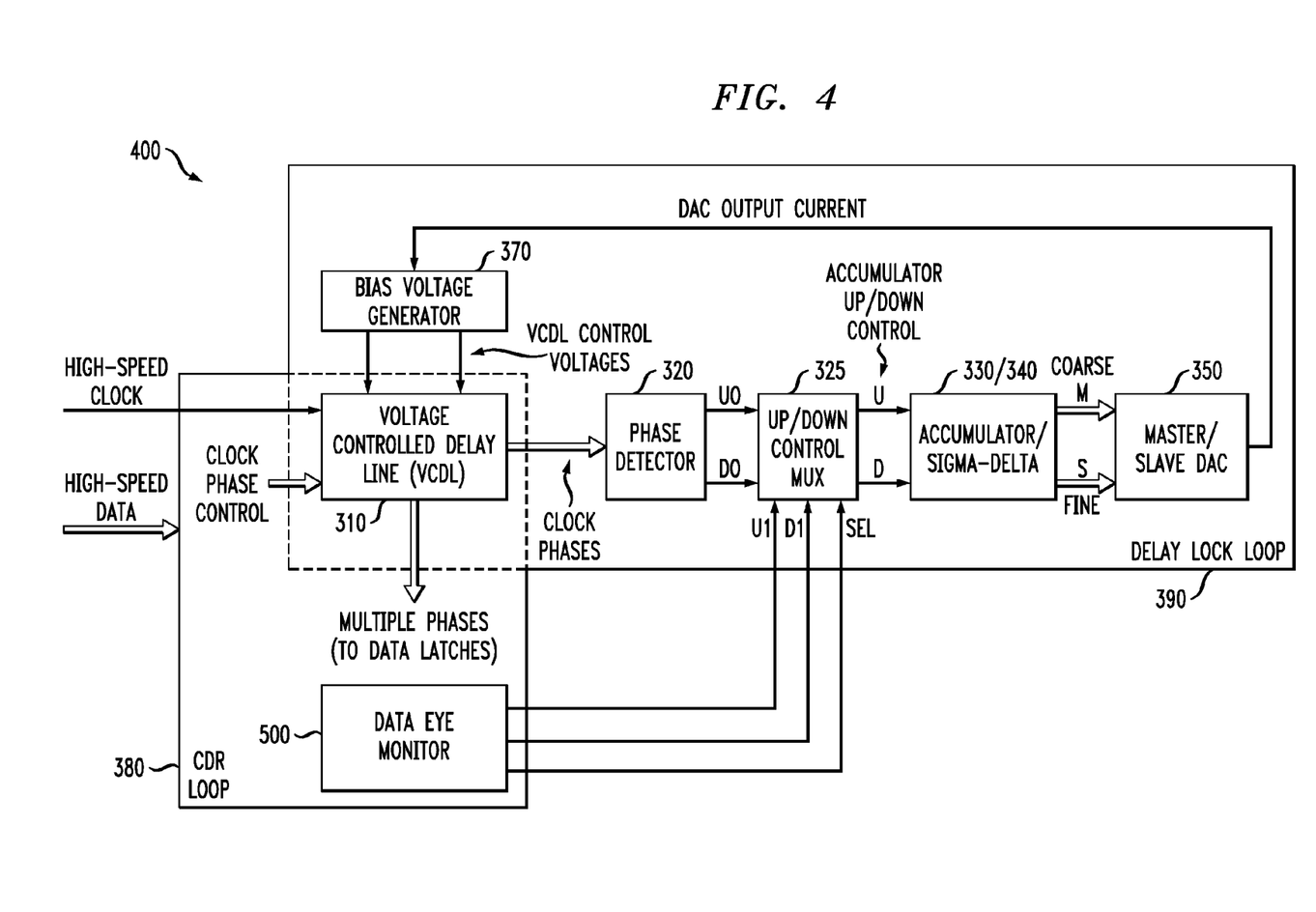
FIG. 4 is a schematic block diagram of a DLL circuit incorporating features of the present invention.

FIG. 4 is a schematic block diagram of a DLL circuit 400 incorporating features of the present invention. The like-numbered elements of FIG. 4 operate in a similar manner to the above discussion in conjunction with FIG. 3. As shown in FIG. 4, a Data Eye Monitor (DEM) 500, discussed below in conjunction with FIG. 5, generates a data histogram measurement that is used to control the DLL up/down control signals, for example, in a fine locking mode. For a discussion of coarse and fine locking modes, see, U.S. patent application Ser. No. 11/141,498, entitled "Method and Apparatus for Sigma-Delta Phase Control in a Delay-Locked-Loop," incorporated by reference herein. The manner in which the data histogram measurement is obtained is discussed below in conjunction with FIGS. 5 through 8. The data histogram measurement technique is also described in U.S. patent application Ser. No. 11/095,178, filed Mar. 31, 2005, entitled "Method and Apparatus for Monitoring a Data Eye in a Clock and Data Recovery System," incorporated by reference herein. The manner in which the data histogram measurement is used to control the slave DAC is discussed further below.

Figure 5:
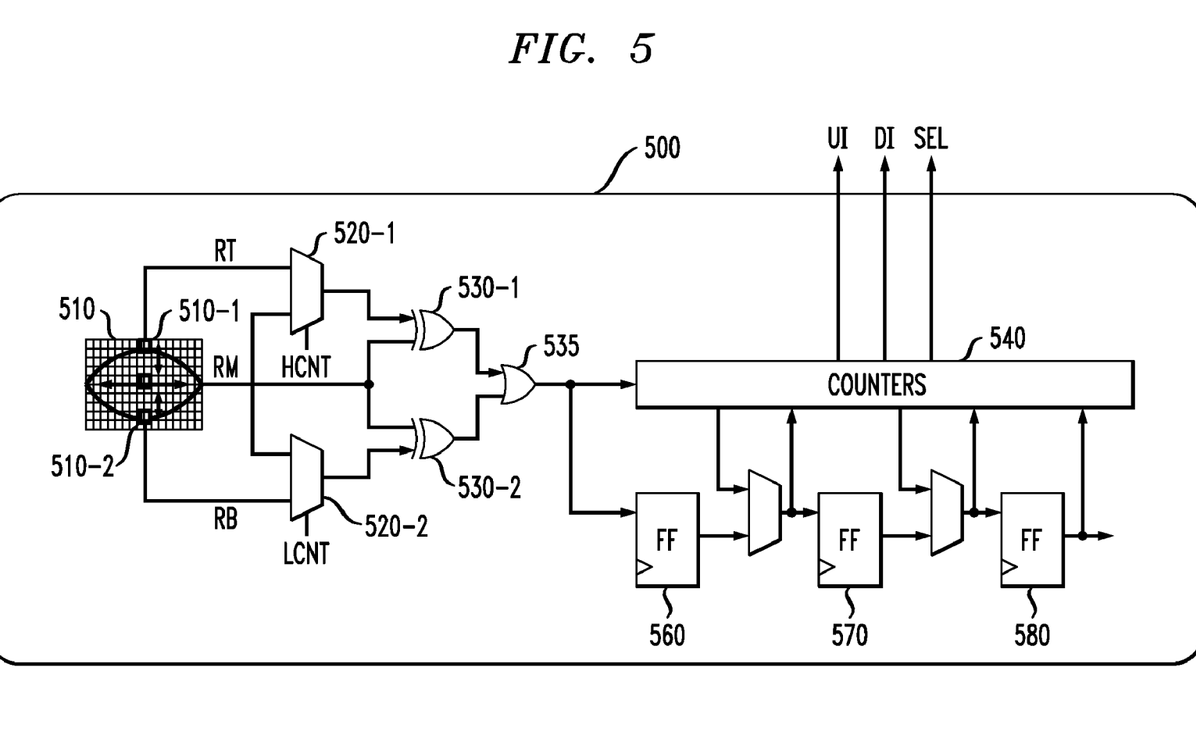
FIG. 5 is a schematic block diagram of a data eye monitor of FIG. 4.

Generally, after the DLL 400 has established a locked state and the CDR control loop is operational, each in accordance with predefined criteria, the width of the data eye is established by the DEM 500 using a Data Histogram Measurement (DHM) technique. The DEM switches control of the DLL up/down signals U0/D0 from the DLL phase detector 320 to the up/down signals U1/D1 of the DEM 500 by means of an UP/DOWN select signal control, SEL, and the UP/DOWN control multiplexer 325. The DEM up/down signals U1/D1 are varied by the DEM 500 to maintain the data eye width within a predefined tolerance of a desired or ideal value, through a fine adjustment of the DLL VCDL delays.

Data Eye Monitor Measurement

FIG. 5 is a schematic block diagram of a Data Eye Monitor 500 As shown in FIG 5, the data eye monitor 500 comprises a pair of roaming latches 510-1 and 510-2 for sampling the corresponding data signal, $D_n$ (shown in FIG. 5 as a data eye within sampling area 510). The roaming latches 510-1 and 510-2 obtain three samples, roaming top (RT), roaming middle (RM) and roaming bottom (RB). The outputs of the roaming latches 510-1 and 510-2 are applied to respective multiplexers 520-1 and 520-2 that are controlled by count control signals HCNT and LCNT, as discussed further below in conjunction with FIGS. 6 and 7.

The outputs of the multiplexers 520 are applied to a pair of exclusive OR (XOR) gates 530-1, 530-2, in the manner shown in FIG. 5 A first XOR gate 530-1 compares the value of the center latch RM to the value of the top latch RT. If the values of the center latch RM and top latch RT match, the XOR gate 530-1 will generate a binary value of 0 and if the values of the center latch RM and top latch RT do not match, the XOR gate 530-1 will generate a binary value of 1, in a known manner Thus, a "hit" occurs for points above the zero crossing when the values of the center latch RM and top latch RT do not match.

Likewise, a second XOR gate 530-2 compares the value of the center latch RM to the value of the bottom latch RB. If the values of the center latch RM and bottom latch RB match, the XOR gate 530-2 will generate a binary value of 0 and if the values of the center latch RM and bottom latch RB do not match, the XOR gate 530-2 will generate a binary value of 1, in a known manner. Thus, a "hit" occurs for points below the zero crossing when the values of the center latch RM and bottom latch RB do not match.

As shown in FIG. 5, the exemplary Data Eye Monitor 500 includes one or more counters 540 for counting the "hit rate" for points above and below the zero crossing, respectively. It is noted that a single shared counter can be employed to count the "hit rate" for points above and below the zero crossing, as would be apparent to a person of ordinary skill in the art. In the exemplary embodiment of FIG. 5, a 3 bit counter is obtained using three flip flops 560, 570, 580. As discussed hereinafter, the count generated by the counter 540 allows the relative location of each edge to be identified. Generally, the count will be 0 until the crossing point that identifies a rising or falling edge. In this manner, the edges on each data line D0 through D17 can be aligned to a common position.

Figure 6:
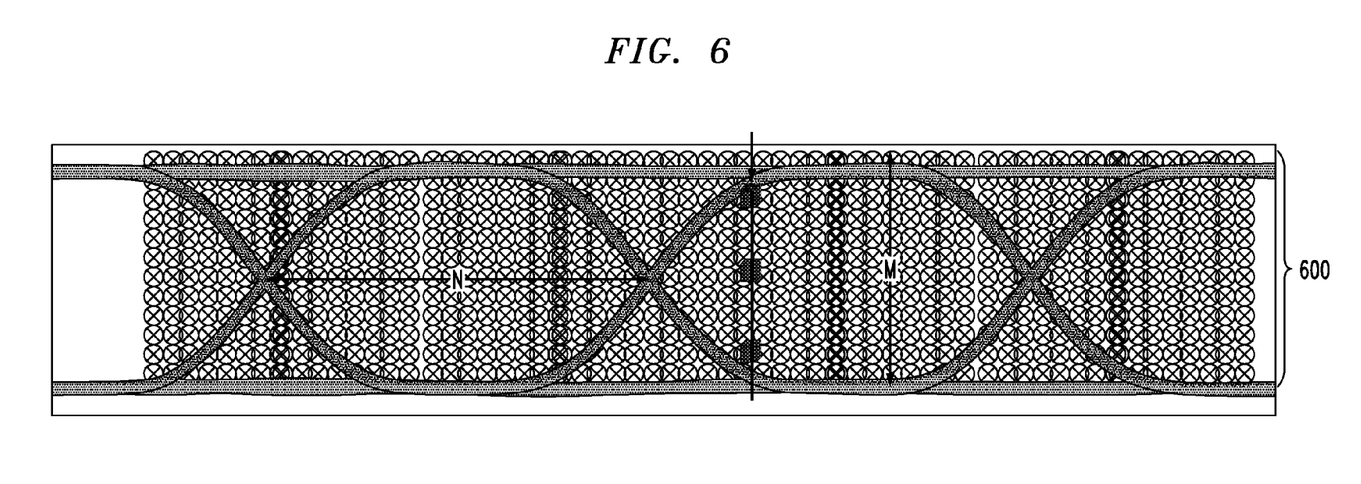
FIG. 6 illustrates a data eye monitor for monitoring a data signal in accordance with one embodiment of the present invention.

FIG. 6 illustrates a data eye monitor 600 for monitoring a data signal in accordance with one embodiment of the present invention. As shown in FIG. 6, the three roaming latches RT, RM and RB of FIG. 5 can be programmed to move horizontally and vertically to provide N×M roaming latch options, with N latch options per data eye having a time orientation (e.g., horizontal) and M latch options per data eye having a voltage orientation (e.g., vertical). In this manner, the data signal can be sampled over N×M positions to obtain an accurate visualization of the transitions. In one exemplary embodiment, there are N=64 steps in the horizontal direction and M=128 steps in the vertical direction (64 steps above the zero crossing and 64 steps below the zero crossing).

Figure 7:
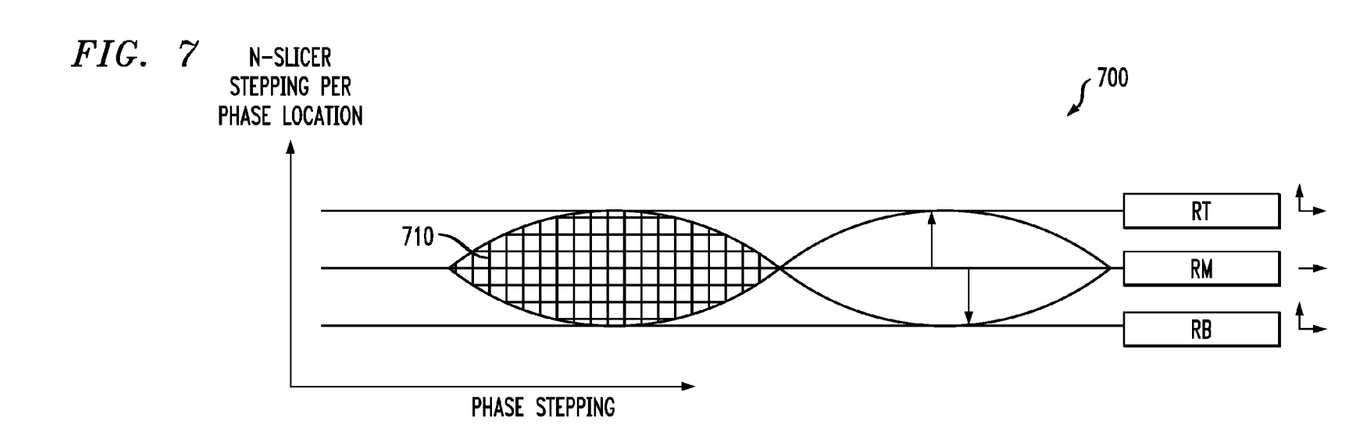
FIG. 7 illustrates the sampling of the data signal by the roaming latches RT, RM and RB, in further detail.

FIG. 7 illustrates the sampling of the data signal by the roaming latches RT, RM and RB, in further detail. As previously indicated, roaming three latches RT, RM and RB can be programmed horizontally to move left and right with N taps per data eye (for example, by interpolating the phase outputs). In addition, the zero cross center latch RM is always fixed in a vertical direction, for example, at the zero cross, as shown in FIG. 7. The top and bottom roaming latches RT and RB can move up and down in a vertical direction from the zero cross RM by programming a variable threshold voltage input to each latch with M voltage levels.

Thus, whether or not the value of the center latch RM matches the value of the top and bottom latches, RT and RB, provides an indication of location of the data transitions (rising and/or falling edges). If the center latch RM has the same value as the top latch RT, they are said to match. Thus, for samples taken inside a data eye, such as the data eye 710, it would be expected that the value of the center latch RM matches the value of the top and bottom latches, RT and RB. For samples taken along the boundary of the data eye, such as the data eye 710, it would be expected that some of the values of the center latch RM will match some of the values of the top and bottom latches, RT and RB. For samples taken outside a data eye, such as the data eye 710, it would be expected that the value of the center latch RM will not match the value of the top and bottom latches, RT and RB.

Figure 8:
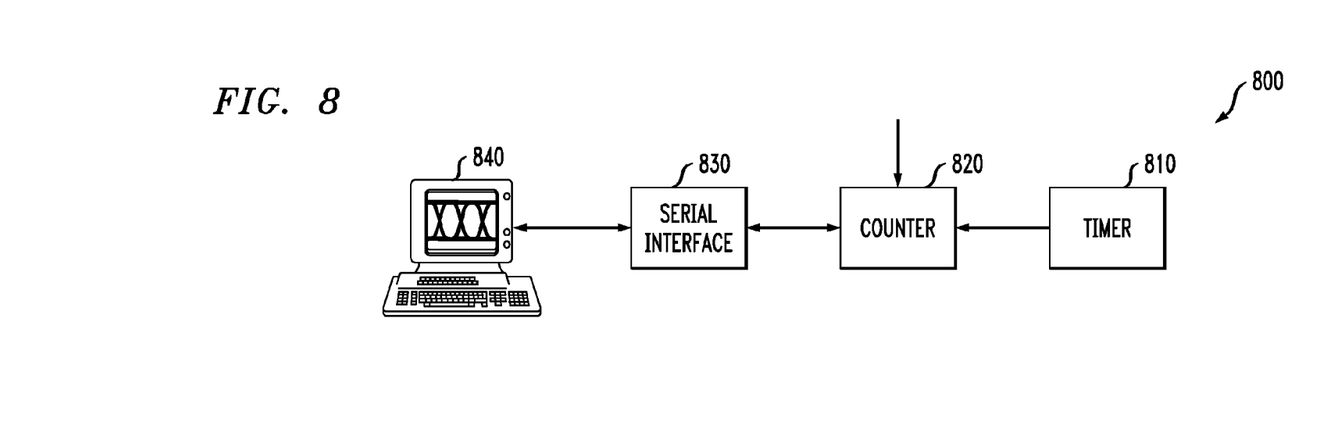
FIG. 8 is a schematic block diagram illustrating a control system for monitoring the skew of a parallel bus.

FIG. 8 is a schematic block diagram illustrating a control system 800 for monitoring the skew of a parallel bus. In one exemplary implementation, for each of the N horizontal positions associated with a given eye, the roaming latches RT, RM and RB are stepped through each of the M vertical levels to obtain the data eye samples. For each position in the N×M array of sampled locations, the respective values of the roaming latches RT, RM and RB are evaluated for a predefined duration, controlled by a timer 810. In one exemplary implementation, for each position in the N×M array of sampled locations, a counter 820 counts the number of mismatches during the predefined duration between the center latch RM and the top and bottom latches, RT and RB. The count metric generated by the counter 820 is provided, for example, via a serial interface 830 to a computing device 840, such as a personal computer or an 8051 microprocessor, for further analysis.

Generally, once the data for the N×M points is loaded into the computing device 840, the data can be analyzed and the skew can be equalized. For a given position in the N×M array of sampled locations, the hit rate can be defined, for example, as the number of mismatches during the predefined duration between the center latch RM and the top or bottom latch, RT, RB, associated with the position. For example, if a given position is above the zero crossing point, the value of the center latch RM is compared to the value of the top latch, RT.

As previously indicated, after the Master/Slave DAC coarse/fine locking modes are complete with the DLL 400 in FIG. 4 having reached a locked state, and the CDR control loop is operational, each in accordance with predefined criteria, the hit-rate is calculated, and the width of the data eye is established by the DEM 500. At this point, the DEM 500 switches control of the DLL U0/D0 up/down signals from the DLL phase detector 320 to U1/D1 up/down signals of the DEM, 500, via the SEL control signal and the UP/DOWN control multiplexer 325. The control of the U1/D1 signals will maximize the data eye width, thru a fine adjustment of the DLL VCDL delays. In one implementation, the DEM up/down signals U1/D1 maintain the data eye width within a predefined tolerance of a desired or ideal value.

One advantage this technique provides is the use of a smaller, lower power "untrimmed" or "minimally-trimmed" DLL phase detector (See, U.S. patent application Ser. No. 11/239,916, filed contemporaneously herewith, entitled, "Method and Apparatus for Trimming a Phase Detector In A Delay Locked Loop," incorporated by reference herein). An untrimmed phase detector may have input delay mismatches that can introduce phase measurement error and ultimately VCDL delay error. The untrimmed/minimally-trimmed phase detector of FIG 4 can be sufficient to obtain DLL "close-to-lock" condition, which would be a sufficient condition for CDR locking operation. Once the CDR is operational, the DEM would take control of the DLL fine locking mode of operation.

Another advantage this technique provides is a more direct DLL control feedback path to the data eye width, compensating for cumulated errors within the DLL control loop.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A method for controlling a delay in a Delay-Locked-Loop circuit, comprising:
   obtaining a plurality of samples of one or more received signals for each of a plurality of unit intervals;
   determining a phase offset between one or more edges of at least one clock signal generated by said Delay-Locked-Loop circuit using a phase detector;
   identifying a location of transitions in said one or more received signals based on said samples using a data eye monitor; and
   adjusting said delay of at least one clock signal (i) based on said identified transition locations by said data eye monitor in a fine locking mode, and (ii) based on a control signal generated by said phase detector in a coarse locking mode.

2. The method of claim 1, further comprising the step of determining a data eye width in said one or more received signals.

3. The method of claim 2, wherein said adjusting step further comprises the step of comparing said data eye width to a predefined value.

4. The method of claim 1, wherein said adjusting step further comprises the step of converting at least one value to an analog bias signal using a master/slave digital-to-analog converter.

5. A method for controlling a delay in a Delay-Locked-Loop circuit, comprising:
   obtaining a plurality of samples of one or more received signals for each of a plurality of unit intervals;
   identifying a location of transitions in said one or more received signals based on said samples; and
   adjusting said delay of at least one clock signal based on said identified transition locations, wherein said adjusting step is not performed until said Delay-Locked-Loop circuit has reached a locked condition based on one or more predefined criteria.

6. A method for controlling a delay in a Delay-Locked-Loop circuit, comprising:
   obtaining a plurality of samples of one or more received signals for each of a plurality of unit intervals;
   identifying a location of transitions in said one or more received signals based on said samples;
   adjusting said delay of at least one clock signal based on said identified transition locations; and
   selecting UP/DOWN signals based on said identified transition locations when said Delay-Locked-Loop circuit reaches a locked condition based on one or more predefined criteria.

7. The method of claim 1, wherein said delay is adjusted based on said phase detector measurement until said Delay-Locked-Loop circuit has reached a locked condition based on one or more predefined criteria.

8. The method of claim 1, wherein said adjusting step further comprises the step of adjusting said delay of one or more delay elements in a VCDL.

9. The method of claim 1, wherein said obtaining step further comprises the steps of sampling a plurality of said received signals using a plurality of latches and estimating a value of one or more of said plurality of said received signals by comparing values of said latches.

10. A Delay-Locked-Loop circuit, comprising:
    a VCDL for generating a plurality of clock signals having a delay; and
    a phase detector for determining a phase offset between one or more edges of at least one clock signal generated by said VCDL in a coarse locking mode;
    a data eye monitor configured to:
       obtain a plurality of samples of one or more received signals for each of a plurality of unit intervals;
       identify a location of transitions in said one or more received signals based on said samples; and
       generate a control signal that adjusts said delay of at least one of said plurality of clock signals in a fine locking mode based on said identified transition locations.

11. The Delay-Locked-Loop circuit of claim 10, wherein said data eye monitor further comprises the step of determining a data eye width.

12. The Delay-Locked-Loop circuit of claim 11, wherein said step of generating a control signal further comprises the step of comparing said data eye width to a predefined value.

13. The Delay-Locked-Loop circuit of claim 10, wherein said control signal is applied to a master/slave digital-to-analog converter that converts at least one value to an analog bias signal.

14. A Delay-Locked-Loop circuit, comprising:
   a VCDL for generating a plurality of clock signals having a delay; and
   a data eye monitor configured to:
      obtain a plurality of samples of one or more received signals for each of a plurality of unit intervals;
      identify a location of transitions in said one or more received signals based on said samples; and
      generate a control signal that adjusts said delay of at least one of said plurality of clock signals based on said identified transition locations, wherein said delay adjustment is not performed until said Delay-Locked-Loop circuit has reached a locked condition based on one or more predefined criteria.

15. The Delay-Locked-Loop circuit of claim 10, wherein said phase detector controls an adjustment of said delay until said Delay-Locked-Loop circuit has reached a locked condition based on one or more predefined criteria.

16. The Delay-Locked-Loop circuit of claim 10, wherein said data eye monitor is further configured to sample a plurality of said received signals using a plurality of latches and estimating a value of one or more of said plurality of said received signals by comparing values of said latches.

17. A method for controlling a delay in a Delay-Locked-Loop circuit, comprising:
   obtaining a plurality of samples of one or more received signals for each of a plurality of unit intervals;
   determining a phase offset between one or more edges of at least one clock signal generated by said Delay-Locked-Loop circuit using a phase detector;
   determining a data eye width in said one or more received signals using a data eye monitor; and
   adjusting said delay of at least one clock signal (i) based on said data eye width from said data eye monitor in a fine locking mode, and (ii) based on a control signal generated by said phase detector in a coarse locking mode.

18. The method of claim 17, wherein said adjusting step further comprises the step of comparing said data eye width to a predefined value.

19. A method for controlling a delay in a Delay-Locked-Loop circuit, comprising:
   obtaining a plurality of samples of one or more received signals for each of a plurality of unit intervals;
   determining a data eye width in said one or more received signals; and
   adjusting said delay of at least one clock signal based on said data eye width, wherein said adjusting step is not performed until said Delay-Locked-Loop circuit has reached a locked condition based on one or more predefined criteria.

* * * * *